United States Patent
Fantini

(10) Patent No.: US 10,672,835 B2
(45) Date of Patent: Jun. 2, 2020

(54) THERMAL INSULATION FOR THREE-DIMENSIONAL MEMORY ARRAYS

(71) Applicant: Micron Technology, Inc., Boise, ID (US)

(72) Inventor: Paolo Fantini, Vimercate (IT)

(73) Assignee: Micron Technology, Inc., Boise, ID (US)

(*) Notice: Subject to any disclaimer, the term of this patent is extended or adjusted under 35 U.S.C. 154(b) by 7 days.

(21) Appl. No.: 15/855,669

(22) Filed: Dec. 27, 2017

(65) Prior Publication Data

US 2018/0204880 A1  Jul. 19, 2018

Related U.S. Application Data

(62) Division of application No. 15/088,475, filed on Apr. 1, 2016, now Pat. No. 9,947,721.

(51) Int. Cl.
*H01L 27/24* (2006.01)
*G11C 13/00* (2006.01)
(Continued)

(52) U.S. Cl.
CPC .......... *H01L 27/249* (2013.01); *G11C 13/004* (2013.01); *G11C 13/0026* (2013.01);
(Continued)

(58) Field of Classification Search
None
See application file for complete search history.

(56) References Cited

U.S. PATENT DOCUMENTS

| 5,920,788 A * | 7/1999 | Reinberg | G11C 11/56 257/2 |
| 6,559,014 B1 * | 5/2003 | Jeon | H01L 21/28158 257/E21.192 |

(Continued)

FOREIGN PATENT DOCUMENTS

| EP | 2887396 A1 | 6/2015 |
| JP | 2013533628 A | 8/2013 |

(Continued)

OTHER PUBLICATIONS

ISA/EPO, International Search Report and Written Opinion of the International Searching Authority, Int'l. Appl. No. PCT/US2017/022984, dated Jun. 7, 2017, Korean Intellectual Property Office, Seo-gu, Daejeon, Republic of Korea, 15 pgs.

(Continued)

*Primary Examiner* — David E Graybill
(74) *Attorney, Agent, or Firm* — Holland & Hart LLP

(57) ABSTRACT

Methods, systems, and devices for a three-dimensional memory array are described. Memory cells may transform when exposed to elevated temperatures, including elevated temperatures associated with a read or write operation of a neighboring cell, corrupting the data stored in them. To prevent this thermal disturb effect, memory cells may be separated from one another by thermally insulating regions that include one or several interfaces. The interfaces may be formed by layering different materials upon one another or adjusting the deposition parameters of a material during formation. The layers may be created with planar thin-film deposition techniques, for example.

17 Claims, 8 Drawing Sheets

(51) Int. Cl.
*H01L 45/00* (2006.01)
*G11C 7/04* (2006.01)

(52) U.S. Cl.
CPC ...... *G11C 13/0028* (2013.01); *G11C 13/0069* (2013.01); *H01L 27/2409* (2013.01); *H01L 27/2418* (2013.01); *H01L 27/2427* (2013.01); *H01L 45/1253* (2013.01); *H01L 45/142* (2013.01); *H01L 45/143* (2013.01); *H01L 45/1683* (2013.01); *G11C 7/04* (2013.01); *G11C 13/0004* (2013.01); *G11C 13/0033* (2013.01); *G11C 2213/71* (2013.01); *H01L 45/06* (2013.01); *H01L 45/1226* (2013.01); *H01L 45/1293* (2013.01); *H01L 45/144* (2013.01)

(56) References Cited

U.S. PATENT DOCUMENTS

| | | | |
|---|---|---|---|
| 7,800,091 B2 | 9/2010 | Kamigaichi et al. | |
| 7,910,914 B2 | 3/2011 | Tanaka et al. | |
| 8,124,968 B2 | 2/2012 | Koo et al. | |
| 8,716,780 B2* | 5/2014 | Kellam | G11C 5/02 257/314 |
| 8,729,523 B2 | 5/2014 | Pio | |
| 8,803,214 B2 | 8/2014 | Tang et al. | |
| 8,841,649 B2 | 9/2014 | Pio | |
| 8,940,388 B2* | 1/2015 | Antonov | H01G 4/306 257/303 |
| 9,099,637 B2 | 8/2015 | Song | |
| 9,136,359 B2* | 9/2015 | Song | H01L 29/7926 |
| 9,153,777 B2 | 10/2015 | Boniardi et al. | |
| 9,252,362 B2 | 2/2016 | Pio | |
| 9,286,975 B2 | 3/2016 | Chu et al. | |
| 9,331,088 B2 | 5/2016 | Takaki | |
| 9,443,866 B1 | 9/2016 | Sakakibara | |
| 9,460,931 B2 | 10/2016 | Pachamuthu et al. | |
| 9,484,389 B2 | 11/2016 | Wouters et al. | |
| 9,524,977 B2 | 12/2016 | Sharangpani et al. | |
| 9,524,981 B2 | 12/2016 | Pachamuthu et al. | |
| 9,583,539 B2 | 2/2017 | Takaki | |
| 9,589,981 B2 | 3/2017 | Nishikawa et al. | |
| 9,595,667 B2 | 3/2017 | Pio | |
| 9,595,669 B2 | 3/2017 | BonhÖte | |
| 9,613,975 B2 | 4/2017 | Huang et al. | |
| 9,627,403 B2 | 4/2017 | Liu et al. | |
| 9,646,975 B2 | 5/2017 | Peri et al. | |
| 9,646,981 B2 | 5/2017 | Nishikawa et al. | |
| 9,679,906 B2 | 6/2017 | Lu et al. | |
| 9,768,234 B2 | 9/2017 | Jo | |
| 9,922,990 B2* | 3/2018 | Song | H01L 27/11582 |
| 9,947,721 B2* | 4/2018 | Fantini | H01L 27/249 |
| 2006/0006450 A1* | 1/2006 | Al-Shareef | H01L 28/56 257/310 |
| 2006/0027924 A1* | 2/2006 | Chen | H01L 21/288 257/751 |
| 2010/0252909 A1 | 10/2010 | Nakanishi et al. | |
| 2011/0303971 A1 | 12/2011 | Lee et al. | |
| 2012/0211722 A1* | 8/2012 | Kellam | G11C 5/02 257/4 |
| 2014/0110775 A1* | 4/2014 | Song | H01L 29/7926 257/325 |
| 2014/0217348 A1* | 8/2014 | Pham | H01L 45/1253 257/2 |
| 2014/0291603 A1* | 10/2014 | Song | H01L 45/1616 257/4 |
| 2014/0361239 A1* | 12/2014 | Ramaswamy | H01L 27/249 257/5 |
| 2015/0021771 A1* | 1/2015 | Lin | H01L 21/76898 257/751 |
| 2015/0348988 A1* | 12/2015 | Song | H01L 27/11582 257/314 |
| 2016/0056210 A1 | 2/2016 | Takaki | |
| 2016/0240312 A1* | 8/2016 | Wang | H05K 1/162 |
| 2016/0276360 A1 | 9/2016 | Doda et al. | |
| 2016/0300848 A1 | 10/2016 | Pachamuthu et al. | |
| 2016/0343718 A1 | 11/2016 | Lu et al. | |
| 2016/0343728 A1* | 11/2016 | Song | H01L 27/11582 |
| 2017/0062454 A1 | 3/2017 | Lu et al. | |
| 2017/0110464 A1 | 4/2017 | Rabkin et al. | |
| 2017/0287980 A1* | 10/2017 | Fantini | H01L 27/249 |
| 2018/0204880 A1* | 7/2018 | Fantini | H01L 27/249 |
| 2019/0044062 A1* | 2/2019 | Fantini | H01L 45/1233 |

FOREIGN PATENT DOCUMENTS

| | | |
|---|---|---|
| JP | 2015106708 A | 6/2015 |
| JP | 2016192514 A | 11/2016 |

OTHER PUBLICATIONS

European Patent Office, "European Search Report," issued in connection with European Patent Application No. 17776301.8, dated Dec. 18, 2019 (6 pages).

Japanese Patent Office, "Office Action," issued in connection with Japanese Patent Application No. 2018-550801, dated Nov. 26, 2019 (9 pages).

* cited by examiner

THERMAL INSULATION FOR THREE-DIMENSIONAL MEMORY ARRAYS

CROSS REFERENCE

The present Application for Patent is a divisional of U.S. patent application Ser. No. 15/088,475 by Fantini, entitled "Thermal Insulation For Three-Dimensional Memory Arrays," filed Apr. 1, 2016, assigned to the assignee hereof, and is expressly incorporated by reference in its entirety herein.

BACKGROUND

The following relates generally to memory devices and more specifically to thermal insulation for three-dimensional memory arrays.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., PCM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

PCM may be non-volatile and may offer improved read/write speeds and endurance compared to other memory devices. PCM may also offer increased memory cell density. For example, three-dimensional memory arrays may be possible with PCM.

Some memory types may generate heat during operation, for example, reading or writing a memory cell. For example, a PCM memory cell may be heated to high temperatures during a read or write operation. Other memory types or memory cell operations may generate heat as well. This heating may increase the temperature of neighboring memory cells, which may corrupt the stored data of the array. Such heating may make the array unreliable for data storage or place constraints on memory cell spacing, which may inhibit future cost savings or increases in memory array performance.

BRIEF DESCRIPTION OF THE DRAWINGS

The disclosure herein refers to and includes the following figures.

DETAILED DESCRIPTION

Figure 1:
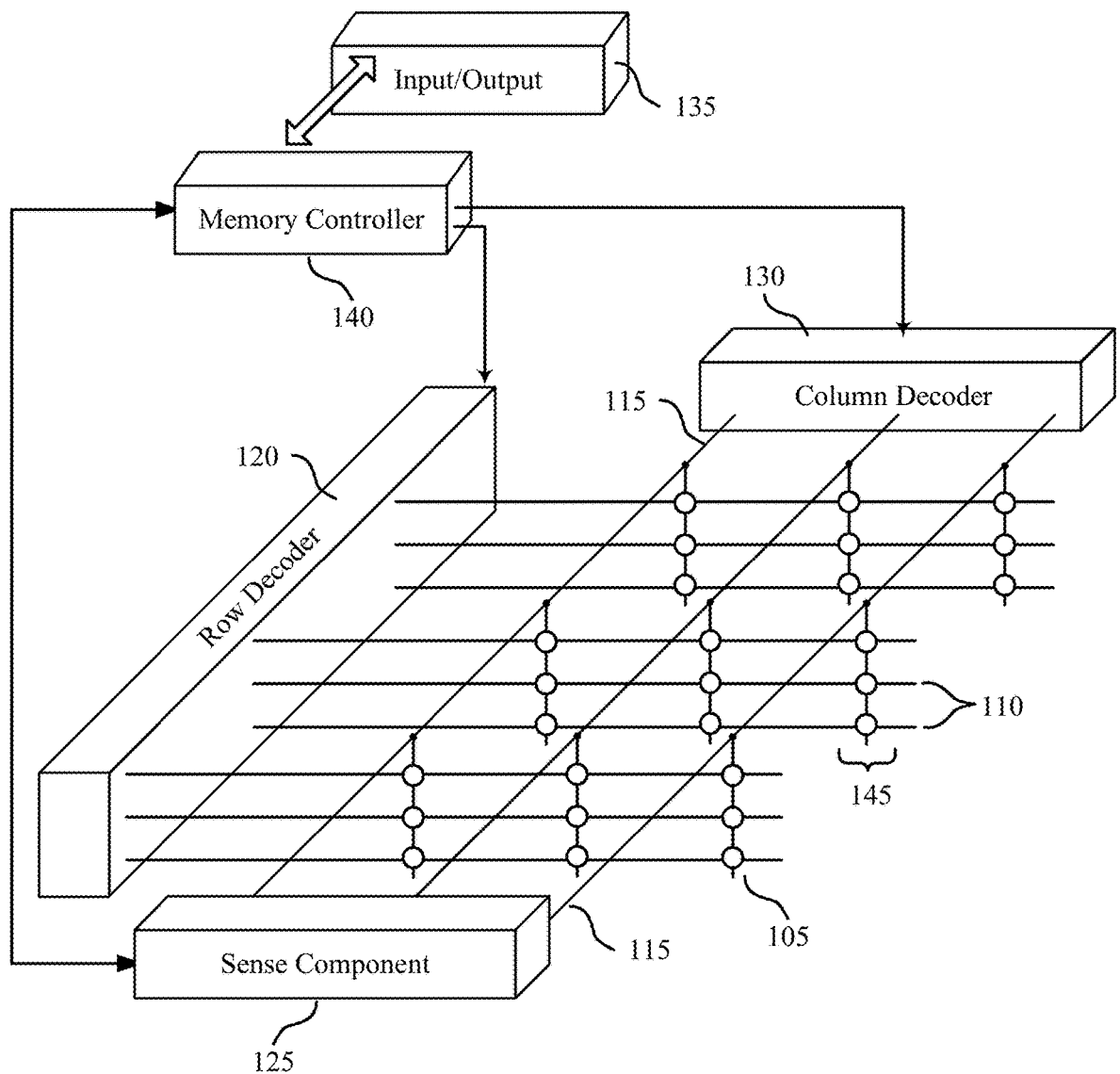
FIG. 1 illustrates an example memory array that supports thermal insulation for three-dimensional memory arrays in accordance with various embodiments of the present disclosure.

Thermal effects between and among memory cells of an array may significantly limit the performance of the memory array. Reducing negative thermal effects between memory cells of an array may thus allow for increased capacity, reliability, and cost-effectiveness of the array.

Decreased manufacturing costs and increased performance of memory arrays may depend on increasing memory cell density by forming memory cells close to one another on a planar substrate. Three-dimensional (3D) memory arrays have given rise to another dimension for memory arrays to expand, significantly increasing memory cell density for a given planar substrate. These 3D architectures may also enable reduction in component size and increased memory cell density. As memory cells are packed more closely together, however, their operation may affect neighboring memory cells.

In some memory technologies, including phase change memory (PCM), reading or writing the logic state of the memory cell may result in the heating of the memory cell. Logic states in PCM may be set by controlling the electrical resistance of a memory cell. This may include melting and then cooling a material of the memory cell to create a high resistance state. In other cases, a memory cell may be heated to moderately high temperatures to create a low electrical resistance state. Heating one memory cell, however, may affect neighboring cells. As the heat diffuses away, the neighboring cell may increase in temperature. This may transform the material of the neighboring cell and ultimately change or corrupt the stored data. This so-called "thermal disturb" may become increasingly problematic as memory cells are packed more closely together. In some cases, thermal disturb may limit further reduction in memory cell spacing.

Thus, as described herein, a memory array architecture that thermally insulates memory cells is described. Memory cells may be separated by thermally insulating regions. These regions may include one or more sublayers to create one or more interfaces, which may increase the thermal resistance of the region. The interfaces may be formed in a number of ways, including layering different materials upon one another or adjusting the deposition parameters of a material during deposition. In some embodiments, the interfaces may be substantially parallel to a substrate and, thus, may be created by cost-effective planar thin-film deposition techniques.

Features and techniques introduced above are further described below in the context of a memory array. Specific examples are then described for three-dimensional memory arrays with thermally insulating layers that minimize thermal disturb of adjacent memory cells. These and other features of the disclosure are further illustrated by and described with reference to apparatus diagrams, system diagrams, and flowcharts that relate to reduced thermal disturb in three-dimensional memory arrays. Although the present disclosure is discussed in terms of PCM, it may apply to other memory types. For example, other memory types that use increased temperatures to read or write a memory cell. Or, in other examples, where the operation of the memory device generates heat that may disturb memory cells.

FIG. 1 illustrates an example memory array 100 that supports thermal insulation for three-dimensional memory arrays in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted a logic 0 and a logic 1. In some cases, memory cell 105 is configured to store more than two logic states.

A memory cell 105 may include a material, which may be referred to as a memory element, that has a variable and configurable electrical resistance that is representative of the logic states. For example, a material with a crystalline or an amorphous atomic configuration may have different electrical resistances. A voltage applied to the memory cell 105 may thus result in different currents depending on whether the material is in a crystalline or an amorphous state, and the magnitude of the resulting current may be used to determine the logic state stored by memory cell 105. In some cases, the memory cell 105 may have a combination of crystalline and amorphous areas that may result in intermediate resistances, which may correspond to different logic states (i.e., states other than logic 1 or logic 0) and may allow memory cells 105 to store more than two different logic states. As discussed below, the logic state of a memory cell 105 may be set by heating, including melting, the memory element.

Memory array 100 may be a 3D memory array, where two-dimensional (2D) memory arrays are formed on top of one another. This may increase the number of memory cells that may be placed or created on a single die or substrate as compared with 2D arrays, which in turn may reduce production costs or increase the performance of the memory array, or both. According to the example depicted in FIG. 1, Memory array 100 includes three levels; however, the number of levels is not limited to three. The levels may be separated by an electrically insulating material. In some cases, the electrically insulating material may be thermally insulating as well and may contain multiple sublayers to increase the thermal resistance between each level. Each level may be aligned or positioned so that memory cells 105 may be approximately aligned with one another across each level, forming a memory cell stack 145.

Each row of memory cells 105 is connected to a word line 110, and each column of memory cells 105 is connected to a bit line 115. Thus, one memory cell 105 may be located at the intersection of a word line 110 and a bit line 115. This intersection may be referred to as a memory cell's address. In some cases, a bit line 115 may be referred to as a digit line.

References to word lines and bit lines, or their analogues, are interchangeable without loss of understanding or operation. Word lines and bit lines may also be known as access lines. In some cases, word lines 110 and bit lines 115 may be substantially perpendicular to one another to create an array.

In a 3D array, each level in a row may have a word line 110. In some cases, memory cell stack 145 may have an electrode common to the memory cells 105 in memory cell stack 145. For example, a conductive extension may be coupled to a bit line 115 and commonly connected to memory cells 105 in memory cell stack 145. The term electrode may refer to an electrical conductor, and in some cases, may be employed as an electrical contact to a memory cell 105-*a*. An electrode may include a trace, wire, conductive line, conductive layer, or the like that provides a conductive path between elements or components of memory array 100.

Operations such as reading and writing may be performed on memory cells 105 by activating or selecting a word line 110 and bit line 115, which may include applying a voltage or a current to the respective line. Word lines 110 and bit lines 115 may be made of conductive materials, such as metals (e.g., copper, aluminum, gold, tungsten, titanium, etc.), metal alloys, carbon, or other conductive materials, alloys, or compounds. Upon selecting a memory cell 105, the resulting signal may be used to determine the stored logic state. For example, a voltage may be applied and the resulting current may be used to differentiate between the electrically resistive states of the phase change material. In some cases, reading, writing, or resetting the memory cell 105 may increase its temperature, which may thermally disturb, or corrupt, data stored in neighboring memory cells 105. As discussed herein, forming multiple thermally insulating layers between memory cells 105 may thermally insulate neighboring memory cells 105 and minimize thermal disturb.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and bit line 115) and the magnitude of the resulting current may depend on the electrical resistance of the memory cell 105. Likewise, a current may be applied to a memory cell 105 and the magnitude of the voltage to create the current may depend on the electrical resistance of the memory cell 105. In some cases, sensing may depend on a threshold voltage; that is, sensing may depend on a voltage at which point a current begins to flow. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or sense component 125 may connected to or in electronic communication with column decoder 130 or row decoder 120.

A memory cell 105 may be set, or written, by similarly activating the relevant word line 110 and bit line 115—i.e., a logic value may be stored in the memory cell 105. Column decoder 130 or row decoder 120 may accept data, for example input 135, to be written to the memory cells 105. In the case of phase change memory, a memory cell 105 is written by heating the memory element, for example, by passing a current through the memory element. This process is discussed in more detail below. As with reading memory cell 105, writing memory cell 105 may increase its temperature—e.g., the temperature of memory cell 105 may be increased above its melting temperature—which may corrupt data stored in neighboring memory cells 105. This type of inter-cell thermal effect that tends to have a corruptive effect may be referred to as thermal disturb. As discussed herein, forming multiple thermally insulating layers between memory cells 105 may minimize thermal disturb of neighboring memory cells 105.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM cells may have beneficial properties that may result in improved performance relative to other memory architectures. For example, PCM may offer comparable read/write speeds as DRAM but may be non-volatile and allow for increased cell density.

The memory controller 140 may control the operation (read, write, re-write, refresh, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltage potentials or currents used during the operation of memory array 100. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
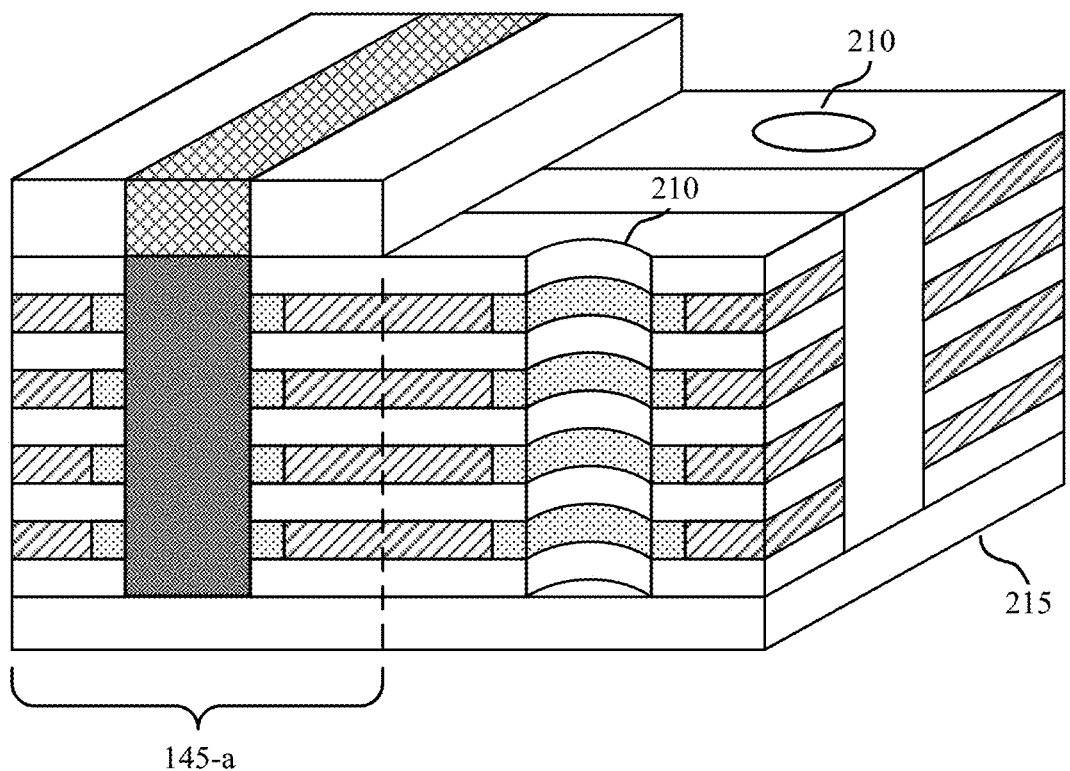
FIG. 2 illustrates an example memory array that supports thermal insulation for three-dimensional memory arrays in accordance with various embodiments of the present disclosure.
Figure 2:
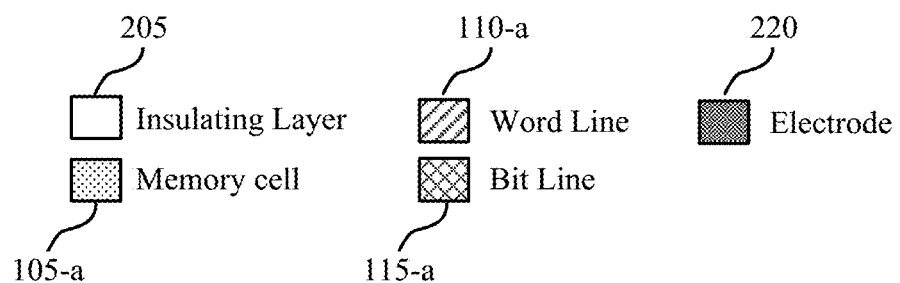

FIG. 2 illustrates an example memory array 200 that supports thermal insulation for three-dimensional memory arrays in accordance with various embodiments of the present disclosure. Memory array 200 may be an example of memory array 100 with reference to FIG. 1. As depicted in FIG. 2, memory array 200 includes multiple levels of memory cells 105-*a* stacked in a vertical direction, relative to a substrate, to create memory cell stacks 145-*a*, which may be examples of a memory cell 105 and memory cell stack 145, as described with reference to FIG. 1. Memory array 200 may thus be referred to as a 3D memory array. Memory array 200 also includes word lines 110-*a* and bit lines 115-*a*, which may be examples of a word line 110 and bit line 115, as described with reference to FIG. 1. Memory array 200 includes insulating layers 205, vias 210, substrate 215, and electrode 220. Electrode 220 may be in electronic communication with bit line 115-*a*. Insulating layers 205 may be both electrically and thermally insulating. As described above, various logic states may be stored by programming the electrical resistance of memory cells 105-*a*. In some cases, this includes passing a current through memory cell 105-*a*, heating memory cell 105-*a*, or melting the material of memory cell 105-*a* wholly or partially. Insulating layers 205 may be composed of multiple sublayers, creating one or more interfaces between memory cells 105-*a* that increase the thermal resistance between memory cells 105-*a* within memory cell stack 145-*a*.

Memory array 200 may include an array of memory cell stacks 145-*a*, and each memory cell stack 145-*a* may include multiple memory cells 105-*a*. Memory array 200 may be made by forming a stack of conductive layers, such as word lines 110-*a*, where each conductive layer is separated from an adjacent conductive layer by electrically insulating layers 205. The electrically insulating layers may include oxide or nitride materials, such as silicon oxide, silicon nitride, or other electrically insulating materials. In some cases, electrically insulating layers 205 may be thermally insulating and may include one or more sublayers. The layers of memory array 200 may be formed on a substrate 215, such as a silicon wafer, or any other semiconductor or oxide substrate. Vias 210 may be formed by removing material from the stack of layers through etching or mechanical techniques, or both. Memory elements 105-*a* may be formed by removing material from the conductive layer to create a recess adjacent to via 210 and then forming the variable resistance material in the recess. For example, material may be removed from the conductive layer by etching, and material may be deposited in the resulting recess to form a memory element 105. Each via 210 may be filled with an electrical conductor to create electrode 220, which may be coupled to bit line 115-*a*. In other words, memory cells 105-*a* in a memory cell stack 145-*a* may have a common electrode. Thus, each memory cell 105-*a* may be coupled to a word line 110-*a* and a bit line 115-*a*.

Figure 4:
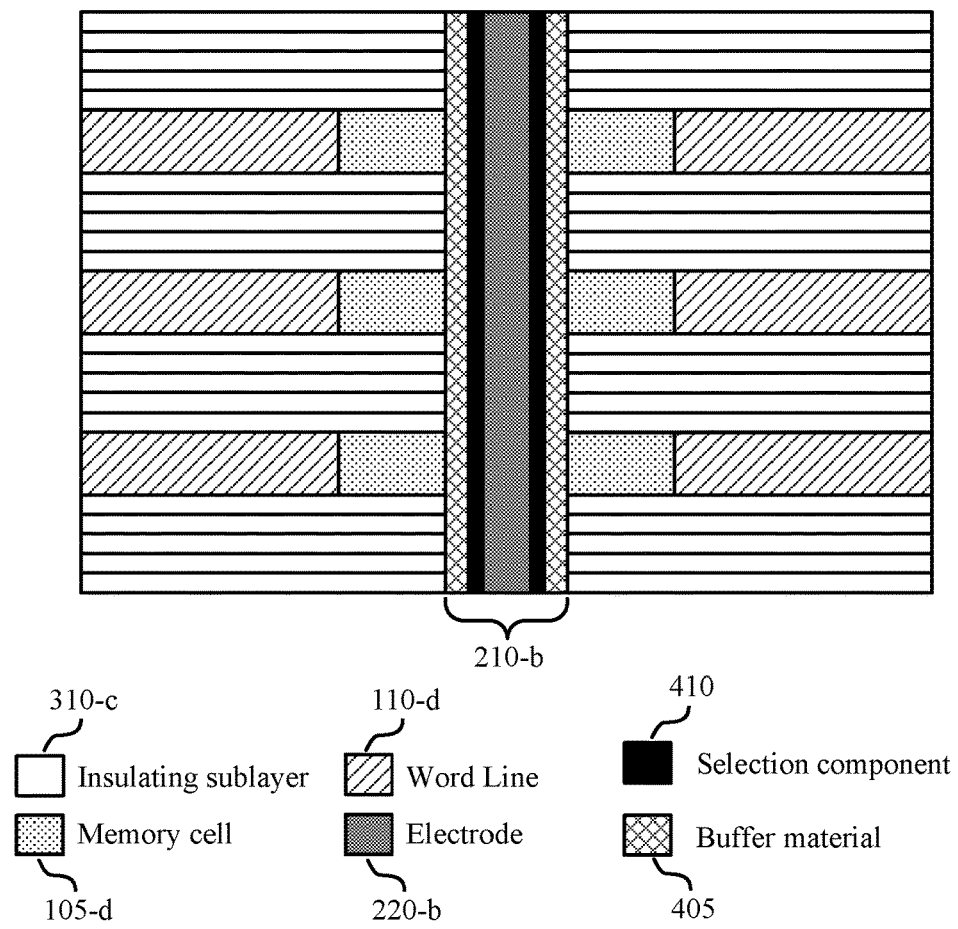
FIG. 4 illustrates an example memory array with a selection component that supports thermal insulation for three-dimensional memory arrays in accordance with various embodiments of the present disclosure.
Figure 5:
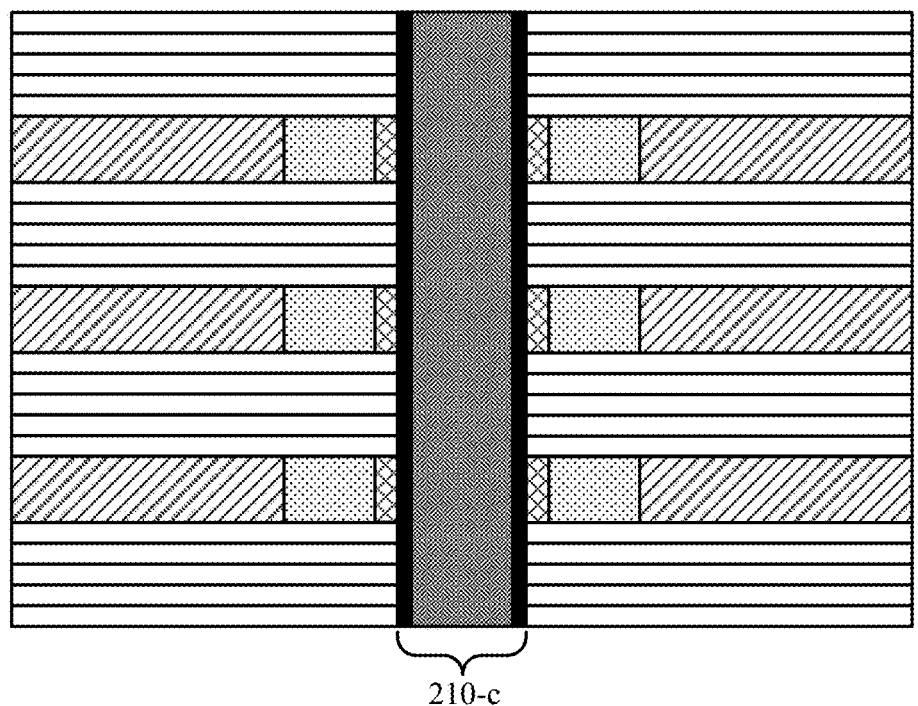
FIG. 5 illustrates an example memory array with a selection component that supports thermal insulation for three-dimensional memory arrays in accordance with various embodiments of the present disclosure.
Figure 5:
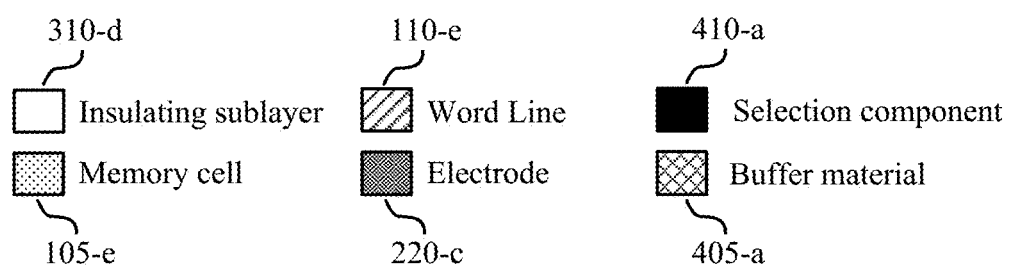
Figure 6:
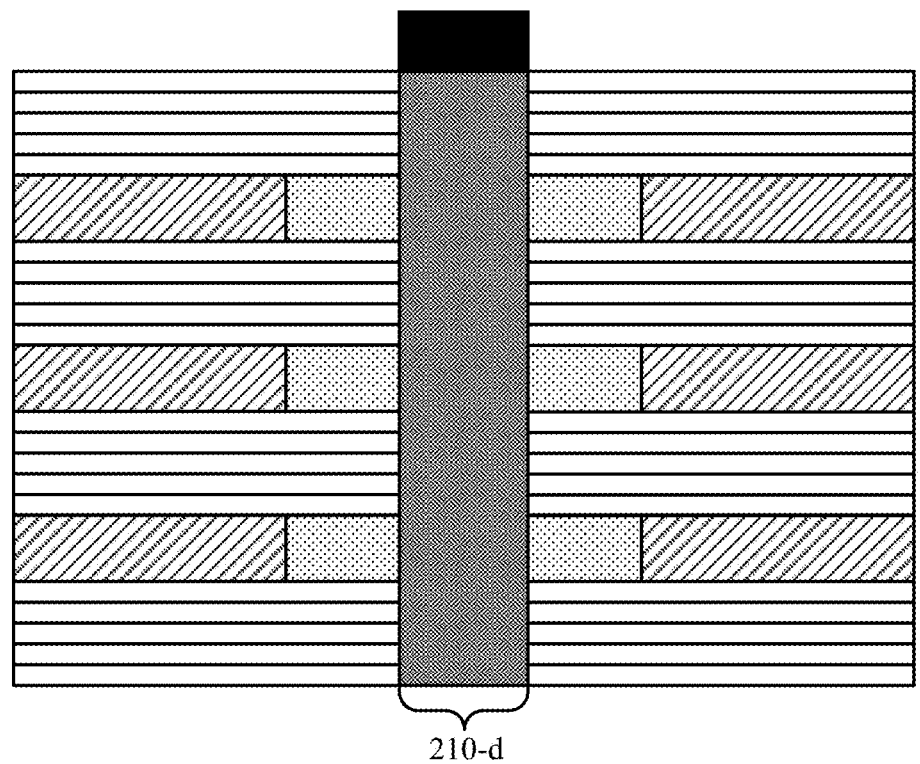
FIG. 6 illustrates an example memory array with a selection component that supports thermal insulation for three-dimensional memory arrays in accordance with various embodiments of the present disclosure.
Figure 6:
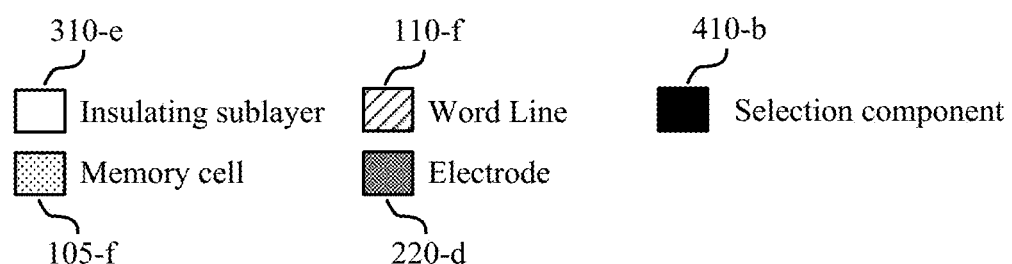

A selection component (e.g., as shown in FIGS. 4-6) may, in some cases, be connected in series between a memory cell 105-*a* and at least one access line, e.g., a word line 110-*a* or a bit line 115-*a*. The selection component may aid in selecting a particular memory cell 105-*a* or may help prevent stray currents from flowing through non-selected memory cells 105-*a* adjacent a selected memory cell 105-*a*. The selection component may include an electrically non-linear component (e.g., a non-ohmic component), such as a metal-insulator-metal (MIM) junction, an ovonic threshold switch (OTS), or a metal-semiconductor-metal (MSM) switch, among other types of two-terminal select device such as a diode. In some cases, the selection component is a chalcogenide film.

Various techniques may be used to form materials or components on a substrate 215. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

As discussed above, memory cells 105-*a* of FIG. 2 may include a material with a variable resistance. Variable resistance materials may refer to various material systems, including, for example, metal oxides, chalcogenides, and the like. Chalcogenide materials are materials or alloys that include at least one of the elements sulfur (S), selenium (Se), or tellurium (Te). Many chalcogenide alloys may be possible—for example, a germanium-antimony-tellurium alloy (Ge—Sb—Te) is a chalcogenide material. Other chalcogenide alloys not expressly recited here may also be employed.

Phase change memory exploits the large resistance contrast between crystalline and amorphous states in phase change materials, which may be chalcogenide materials. A material in a crystalline state may have atoms arranged in a periodic structure, which may result in a relatively low electrical resistance. By contrast, material in an amorphous state with no or relatively little periodic atomic structure may have a relatively high electrical resistance. The difference in resistance values between amorphous and crystalline states of a material may be significant; for example, a material in an amorphous state may have a resistance one or more orders of magnitude greater than the resistance of the material in its crystalline state. In some cases, the material may be partially amorphous and partially crystalline, and the resistance may be of some value between the resistances of the material in a wholly crystalline or wholly amorphous state. So a material may be used for other than binary logic applications—i.e., the number of possible states stored in a material may be more than two.

To set a low-resistance state, a memory cell 105-*a* may be heated by passing a current through the memory cell. Heating caused by electrical current flowing through a material that has a finite resistance may be referred to as Joule or ohmic heating. Joule heating may thus be related to the electrical resistance of electrodes or phase change material. Heating the phase change material to an elevated temperature (but below its melting temperature) may result in the phase change material crystallizing and forming the low-resistance state. In some cases, a memory cell 105-*a* may be heated by means other than Joule heating, for example, by using a laser.

To set a high-resistance state, the phase change material may be heated above its melting temperature, for example, by Joule heating. The amorphous structure of the molten material may be quenched, or locked in, by abruptly removing the applied current to quickly cool the phase change material.

In some examples, a reset operation may include a first heating cycle that melts the phase change material followed by a second heating cycle that crystallizes the phase change material, where the second heating cycle uses a temperature less than the first heating cycle. This reset operation, which includes two heating steps, may disturb nearby memory cells.

As described herein, regions separating memory cells 105-*a*, for example, insulating layers 205, may include one or more interfaces that may increase the thermal resistance of insulating layer 205 by altering the temperature gradient. In some examples, the interfaces separate memory cells 105-*a* stacked in the vertical direction. In other words, memory cells 105-*a* may be stacked one on top of the other and separated from one another by the interfaces. Interfaces may also reduce thermal phonon transport, for example, by scattering phonons. This may reduce thermal transport and increase the thermal resistance. This, in turn, may help prevent the corruption of data stored in memory cells 105-*a* when neighboring memory cells 105-*a* are heated during a read or write operation. For example, the increased thermal resistance may increase the number of cycles a memory cell 105-*a* may be written before corrupting a neighboring memory cell 105-*a*. This is discussed in more detail below.

The one or more interfaces associated with the insulating layers may result from a change in material composition or stoichiometry. For example, two or more layers may be formed on top of one another, where neighboring layers have different chemical compositions, such as alternating layers of an oxide material (for example, $SiO_2$) and a nitride material (for example, SiN). An interface may also be formed by a change in a material's chemical proportions or stoichiometry. For example, instead of a 1-to-1 atomic ratio of SiN, the atomic ratio may be varied, such as 1.2-to-1, 1-to-1.1, etc., for adjacent layers. In some cases, the stoichiometry may be varied by adjusting the deposition parameters during material deposition. For example, the relative concentrations of reactants may be varied during deposition, among other techniques.

In some embodiments, metal layers may be used to provide thermal insulation. Metals are generally good thermal conductors and may aid in removing heat from the area surrounding a memory cell 105-*a*. For example, insulating layer 205 may include multiple sublayers, where at least one sublayer is metallic. Metal layers or sublayers may be electrically insulated from electrodes 220 or access lines (e.g., word line 110-a or bit line 115-a) by, for example, placing electrically insulating material between them.

The memory cells 105 discussed herein are not limited to phase change materials. Other types of memory cells may be affected similarly by thermal disturb, for example, resistive memory or resistive RAM. In some cases, resistive RAM uses metal oxide materials whose electrical resistance is varied by controlling the ionic state of atoms in the material or by controlling the number or location of atomic vacancies, i.e., missing atoms, in the material. Such materials and processes may be heat-sensitive and may thus benefit from the thermal insulation techniques described herein.

Figure 3:
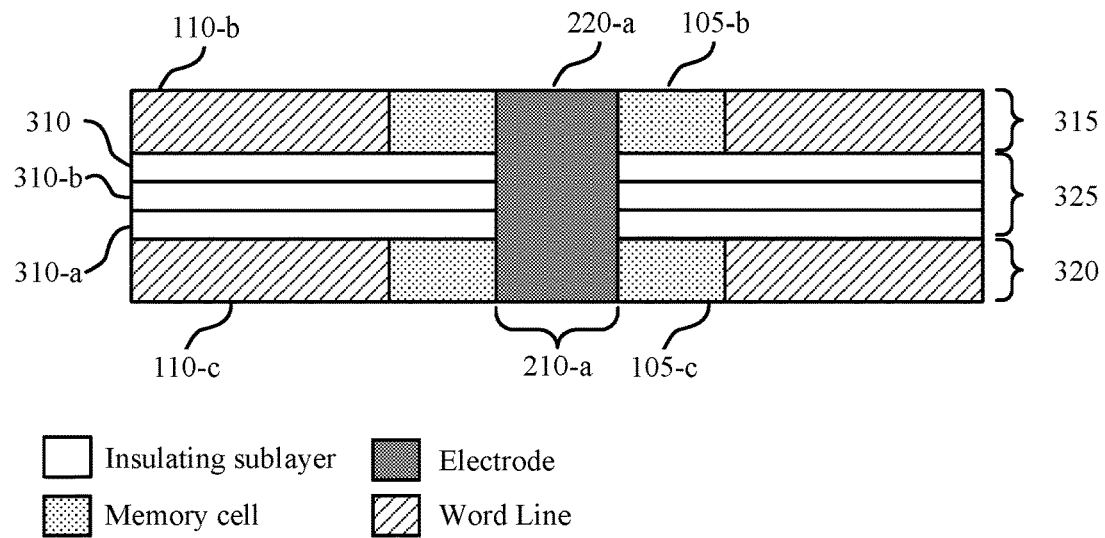
FIG. 3 illustrates an example memory array that supports thermal insulation for three-dimensional memory arrays in accordance with various embodiments of the present disclosure.

FIG. 3 illustrates an example memory array 300 that supports thermal insulation for three-dimensional memory arrays in accordance with various embodiments of the present disclosure. Memory array 300 may be an example of memory array 100 or 200 with reference to FIGS. 1 and 2. As depicted in FIG. 3, memory array 300 includes memory cells 105-b and 105-c, word lines 110-b and 110-c, via 210-a, and electrode 220-a, which may be examples of a memory cell 105, word line 110, via 210, and electrode 220 as described with reference to FIGS. 1 and 2. Memory array 300 also includes insulating sublayers 310, 310-a, and 310-b. A combination of a memory cell 105 and an adjacent electrode (e.g., word line 110) may be referred to as a layer of memory array 300; likewise groups of adjacent sublayers may be referred to as a layer of memory array 300. Thus, memory array 300 may include layers 315, 320, and 325. Layer 325 may consist of various sublayers, such as sublayers 310, 310-a, and 310-b. Insulating sublayers 310, 310-a, and 310-b may be different materials and may form interfaces that increase the thermal resistance between memory cells 105-b and 105-c. In some cases, electrode 220-a may be a bit line 115 or it may be another material that is in electronic communication with a bit line 115, as discussed with reference to FIG. 2.

As discussed above, reading or writing memory cell 105-b may be performed by heating memory cell 105-b. For example, a current may be applied and may flow through word line 110-b, memory cell 105-b, and electrode 220-a, causing one or more of word line 110-b, memory cell 105-b, or electrode 220-a to increase in temperature due to Joule heating. In some cases, this process may heat memory cell 105-b to high temperatures, including above its melting temperature in some cases. The surroundings of memory cell 105-b, including memory cell 105-c, may thus increase in temperature. The heating of memory 105-b may transform and corrupt the data stored in memory cell 105-c. For example, if memory cell 105-c is in an amorphous state, there may be a thermodynamic driving force for it to crystallize, which may change its electrical resistance and thus change the stored logic state.

Although a thermodynamic driving force exists to transform from amorphous to crystalline, the structure may not transform without sufficient kinetic energy. This kinetic energy may be provided thermally. Thus, at low enough temperatures, the stored state may be maintained. At elevated temperatures, however, the amorphous material may crystallize. This may occur at temperatures much lower than the material's melting temperature, for example, on the order of a few hundred degrees Celsius. In general, the time spent at an elevated temperature may determine when memory cell 105-c switches states. So for a given temperature, memory cell 105-c may be corrupted after a certain number of read or write cycles of memory cell 105-b. That is, each read or write cycle of memory cell 105-b may heat memory cell 105-c for some period of time, and after some number of cycles, memory cell 105-c may experience an elevated temperature for a sufficient time such that it transforms and becomes corrupted.

In order to minimize thermal disturb of memory cells 105, the thermal resistance between memory cell 105-b and 105-c may be increased by adding one more interfaces between them. That is, interfaces may be placed between memory cells 105 that are stacked vertically. For example, as depicted in FIG. 3, a first layer 315, may include a first memory cell 105-b coupled to a first electrode, such as word line 110-b. In some cases, a memory cell 105 may be referred to as a memory element 105. A second layer 320 may include a second memory cell 105-c coupled to a second electrode, such as word line 110-c. A third layer 325 may include a stack of at least two sublayers, such as sublayers 310 and 310-a. Although depicted with three sublayers in FIG. 3, two sublayers may be used. More than three sublayers may also be used. Layer 325 may be positioned between layers 315 and 320, where layers 315, 320, and 325 are each substantially parallel to one another. Additionally, a third electrode, such as electrode 220-a, may be coupled to memory elements 105-b and 105-c, and electrode 220-a may be substantially perpendicular to layers 315, 320, and 325. In some cases, memory elements 105-b and 105-c may be coaxial with electrode 220-a, that is, they may share the same axis of revolution. For example, electrode 220-a may be cylindrical and memory elements 105-b and 105-c may be annular and surround electrode 220-a. In other examples, the architecture of memory array 300 may have a configuration that does not include circular symmetric components.

In some cases, sublayers 310 and 310-a may be electrical and thermal insulators. For example, they may be oxide materials. Sublayers 310 and 310-a may each be materials with a different composition or stoichiometry from each other, thus resulting in an interface between them. In some cases, the thermally insulating region within layer 325 may include a third sublayer, such as sublayer 310-b, which may be positioned between sublayers 310 and 310-a. In some cases, sublayer 310-b may be electrically and thermally insulating, such as an oxide material. In other cases, sublayer 310-b may be a thermal conductor, for example, a metal, metal alloy, carbon, or a compound comprising silicon and nitrogen. In such cases, sublayers 310 and 310-a may be electrical insulators in order to electrically insulate sublayer 310-b from word lines 110-b and 110-c and memory elements 105-b and 105-c. In some cases, sublayer 310-b may be electrically insulated from electrode 220-a as well.

Word lines 110-b and 110-c and electrode 220-a may each be composed of at least one of tungsten, tungsten nitride, aluminum, titanium, titanium nitride, silicon, doped polycrystalline silicon, or carbon, or any combination thereof. Memory elements 105-b and 105-c may be materials with a programmable resistivity. They may be chalcogenide materials or phase change materials, or both.

As depicted in FIG. 3, the interfaces formed by sublayers 310 and 310-a may be substantially parallel to the substrate or die, for example, substrate 215 shown in FIG. 2. This orientation may have a number of benefits. For example, it may increase the thermal resistance between memory cells 105-b and 105-c when they are positioned in the 3D, vertical architecture shown in FIG. 3. Additionally, forming sublayers 310 and 310-a may be achieved by simple, planar thin-film deposition processes. For example, physical vapor deposition, which is a line-of-sight deposition process, may produce planar thin-films parallel to the substrate. Such deposition techniques may not be used to produce thin-films extending perpendicular to the substrate.

Memory array 300 may be created by forming a stack comprising a set of conductive layers, where each conductive layer of the set is separated from an adjacent conductive layer of the set by a thermally insulating region. For example, layer 320 may be formed by depositing a conductive material. Layer 325 may be formed on top of layer 320, where layer 325 may include at least two insulating sublayers, e.g., sublayers 310 and 310-a, which may be different electrically insulating materials. This process may be repeated to form a stack, for example, layers 320, 325, and 315 may comprise the stack, although more layers are possible.

Interfaces may be formed in layer 325 by varying the deposited material. For example, sublayer 310-b may be a material different from that of sublayer 310 and 310-a, thus forming interfaces between the sublayers. Sublayers 310, 310-a, and 310-b may be one of an oxide material, a compound containing nitrogen (for example, SiN), a metal, metal alloy, or carbon. In other cases, sublayers 310, 310-a, and 310-b are the same material but may have a different stoichiometry from one another. This may be achieved by varying the deposition parameters during formation. For example, sublayer 310-a may be formed according to one set of deposition parameters and sublayer 310-b may be formed according to another set of deposition parameters.

Via 210-a may be formed through the stack, where at least a portion of via 210-a passes through each conductive layer (for example, layers 320 and 315) of the set of conductive layers. Via 210-a may be formed by removing material from the stack, for example, by etching. In some cases, a photolithography process may be used to define the opening of via 210-a and constrain subsequent etching to the defined region. A recess may be formed in at least one conductive layer (for example, layers 320 or 315) of the set of conductive layers, and the recess may be adjacent to via 210-a. A memory element 105-b or 105-c may be formed in the recess.

By way of example, materials or components in memory array 300 may be formed by depositing material using chemical vapor deposition, metal-organic chemical vapor deposition, physical vapor deposition, or atomic layer deposition. Material may be removed by etching, such as chemical or plasma etching.

FIG. 4 illustrates an example memory array 400 that supports thermal insulation for three-dimensional memory arrays in accordance with various embodiments of the present disclosure. Memory array 400 may be an example of memory array 100, 200, or 300 with reference to FIGS. 1-3. Memory array 400 includes memory cells 105-d, word lines 110-d, via 210-b, electrode 220-b, and insulating sublayers 310-c, which may be examples of memory cells 105, word line 110, via 210, and electrode 220 with reference to FIGS. 1-3, and insulating sublayers 310 with reference to FIG. 3. In some cases, electrode 220-b may be a bit line 115 or it may be an extension from a bit line 115 that is in electronic communication with a bit line 115. Memory array 400 also includes buffer material 405 and selection component 410.

As depicted in FIG. 4, more than two memory cells 105 may be stacked on one another. For example, three memory cells 105-d are shown; however, more than three memory cells 105 may be stacked in some examples. Furthermore, five insulating sublayers 310-c are depicted in FIG. 4, resulting in six interfaces between each memory element 105-d.

As discussed above, selection component 410 may aid in selecting a particular memory cell 105-d or may help prevent stray currents flowing through non-selected memory cells 105 adjacent a selected memory cell 105. Selection component 410 may include an electrically non-linear component (i.e., a non-ohmic component) such as a bipolar junction, a metal-insulator-metal (MIM) junction, an ovonic threshold switch (OTS), or a metal-semiconductor-metal (MSM) switch, among other types of two-terminal select device such as a diode. Selection component 410 may also be a field-effect transistor. In some cases, selection component 410 may be a chalcogenide film. In other cases, selection component 410 may be a material alloy containing selenium, arsenic, and germanium.

Selection component 410 may be located between an electrode, such as a conductive bit line 115 or word line 110-d, and a memory cell 105-d. For example, electrode 220-b may be an extension of a bit line 115, and selection component 410 may be coupled to electrode 220-b and buffer material 405, separating electrode 220-b and buffer material 405, where buffer material 405 may be coupled to a memory cell 105-d.

Buffer material 405 may enhance the chemical separation of selection component 410 and memory element 105-d. For example, buffer material 405 may prevent the chemical mixing of selection component 410 and memory element 105-d when, for instance, memory element 105-d is melted. Buffer material 405 may be a thin oxide material that may electrically conduct by tunneling. In other cases, buffer material 405 may be an electrically conductive material, such as an electrode material.

Memory array 400 may be formed in a similar manner as discussed in FIG. 3. After forming via 210-b and memory elements 105-d, buffer material 405 may be formed on the surface of via 210-b, and buffer material 405 may be coupled to memory elements 105-d. Selection component 410 may be formed on the surface of buffer material 405 in via 210-b, where selection component 410 may be coupled to buffer material 405. Electrode 220-b may be formed, where electrode 220-b may fill a remainder of via 210-b and may be coupled to selection component 410.

FIG. 5 illustrates an example memory array 500 that supports thermal insulation for three-dimensional memory arrays in accordance with various aspects of the present disclosure. Memory array 500 may be an example of memory array 100, 200, 300, or 400 with reference to FIGS. 1-4. Memory array 500 includes memory cells 105-e, word lines 110-e, via 210-c, electrode 220-c, insulating sublayers 310-d, selection component 410-a, and buffer material 405-a, which may be examples of memory cells 105, word line 110, via 210, electrode 220, insulating sublayers 310, selection component 410, and buffer material 405 with reference to FIGS. 1-4. In some cases, electrode 220-c may be a bit line 115 or it may be an extension from a bit line 115 that is in electronic communication with a bit line 115.

Selection component 410-a may be located between an electrode, such as a conductive bit line 115, and a memory cell 105-e. For example, electrode 220-c may be an extension of a bit line 115, which may be a conductive line, and selection component 410-a may be coupled to electrode 220-c, separating electrode 220-c and a memory element 105-e. In some cases, buffer material 405-a separates selection component 410-a and a memory element 105-e. Buffer material 405-a may enhance the chemical separation of selection component 410-a and memory element 105-e. For example, buffer material 405-a may prevent the chemical mixing of selection component 410-a and memory element 105-*e* when, for instance, memory element 105-*e* is melted. Buffer material 405-*a* may be an oxide material that is thin enough such that it may electrically conduct by tunneling. In other cases, buffer material 405-*a* may be an electrically conductive material.

Memory array 500 may be formed in a similar manner as discussed in FIG. 3. After forming via 210-*c*, a recess may be formed in word line 110-*e*. A memory cell 105-*e* may be formed in the recess. Buffer material 405-*a* may be formed on memory cell 105-*e*. In some cases, both the buffer material 405-*a* and the memory cell 105-*e* are within the recess. Selection component 410-*a* may be formed on the surface of via 210-*c*, where selection component 410-*a* may be coupled to buffer material 405-*a*, and buffer material 405-*a* separates selection component 410-*a* and memory element 105-*e*. Electrode 220-*c* may be formed, where electrode 220-*c* may fill a remainder of via 210-*c* and may be coupled to selection component 410-*a*.

FIG. 6 illustrates an example memory array 600 that supports thermal insulation for three-dimensional memory arrays in accordance with various aspects of the present disclosure. Memory array 600 may be an example of memory array 100, 200, 300, 400, or 500 with reference to FIGS. 1-5. Memory array 600 includes memory cells 105-*f*, word lines 110-*f*, via 210-*d*, electrode 220-*d*, insulating sublayers 310-*e*, and selection component 410-*b* which may be examples of memory cells 105, word line 110, via 210, electrode 220, insulating sublayers 310, and selection component 410 with reference to FIGS. 1-5.

Memory array 600 may be formed in a similar manner as discussed in FIG. 3, where electrode 220-*d* fills an entirety of via 210-*d* and may be coupled to memory elements 105-*f*. Selection component 410-*b* may be formed at one end of electrode 220-*d* and may be coupled to electrode 220-*d*. For example, selection component 410-*b* may be positioned between electrode 220-*d* and a bit line 115 (not shown), which may be a conductive line, such that they are coupled. In some cases, selection component 410-*b* may be formed below the memory array, i.e., at the bottom of via 210-*d*. In some examples, selection component 410-*b* may be planar with the top or bottom of via 210-*d*, that is, it may be planar with the top or bottom insulating sublayers 310-*e*.

Figure 7:
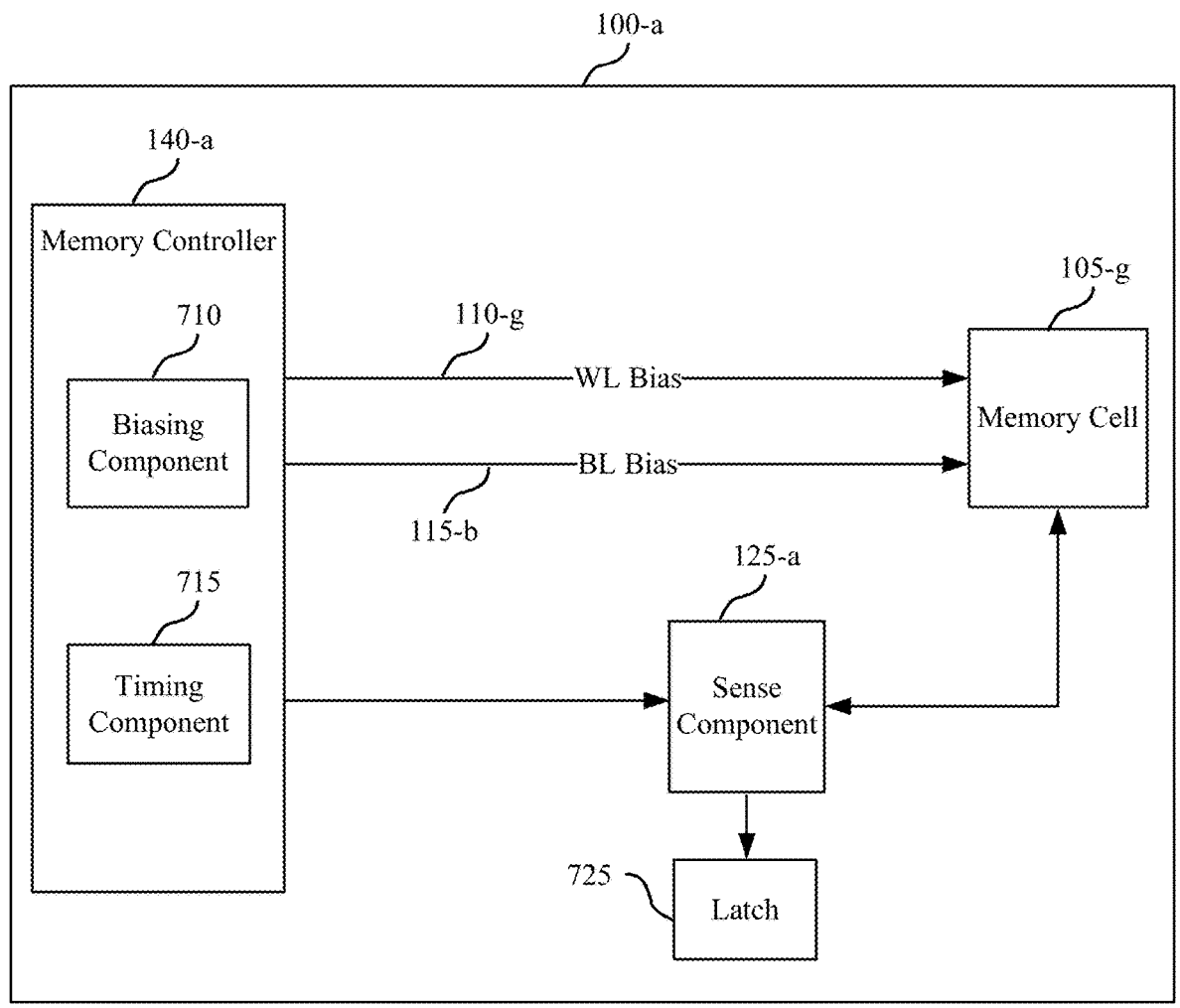
FIG. 7 illustrates an example memory array that supports thermal insulation for three-dimensional memory arrays in accordance with various embodiments of the present disclosure.

FIG. 7 shows a block diagram 700 of a memory array 100-*a* that supports thermal insulation for three-dimensional memory arrays in accordance with various aspects of the present disclosure. Memory array 100-*a* may be referred to as an electronic memory apparatus and may be an example of memory array 100, 200, 300, 400, 500, or 600 described in FIGS. 1-6. Memory array 100-*a* includes memory controller 140-*a* and memory cell 105-*g*, which may be examples of memory controller 140 described with reference to FIG. 1, and a memory cell 105 as described with reference to FIGS. 1-6. Memory controller 140-*a* may include biasing component 710 and timing component 715 and may operate memory array 100-*a* as described in FIGS. 1-3. Memory controller 140-*a* may be in electronic communication with word line 110-*g*, bit line 115-*b*, and sense component 125-*a*, which may be examples of word line 110, bit line 115, and sense component 125, described with reference to FIG. 1 or 2. Memory array 100-*a* may also include latch 725. The components of memory array 100-*a* may be in electronic communication with one another and may perform the functions described with reference to FIGS. 1-3. In some cases, sense component 125-*a* and latch 725 may be components of memory controller 140-*a*.

Memory controller 140-*a* may be configured to activate word line 110-*g* or bit line 115-*b* by applying voltages or currents to those various nodes. For example, biasing component 710 may be configured to apply a voltage to operate memory cell 105-*g* to read or write memory cell 105-*g* as described above. The applied voltage may be based on a desired current as well as the resistance of memory cell 105-*g* and any electrodes. In some cases, memory controller 140-*a* may include a row decoder, column decoder, or both, as described with reference to FIG. 1. This may enable memory controller 140-*a* to access one or more memory cells 105-*g*. Biasing component 710 may also provide voltages to operate sense component 125-*a*.

In some cases, memory controller 140-*a* may perform its operations using timing component 715. For example, timing component 715 may control the timing of the various word line or bit line selections, including timing for switching and voltage application to perform the memory functions, such as reading and writing, discussed herein. In some cases, timing component 715 may control the operations of biasing component 710.

Sense component 125-*a* may include voltage or current sense amplifiers to determine the stored logic state in memory cell 105-*g*. Upon determining the logic state, sense component 125-*a* may then store the output in latch 725, where it may be used in accordance with the operations of an electronic device using memory array 100-*a*.

Figure 8:
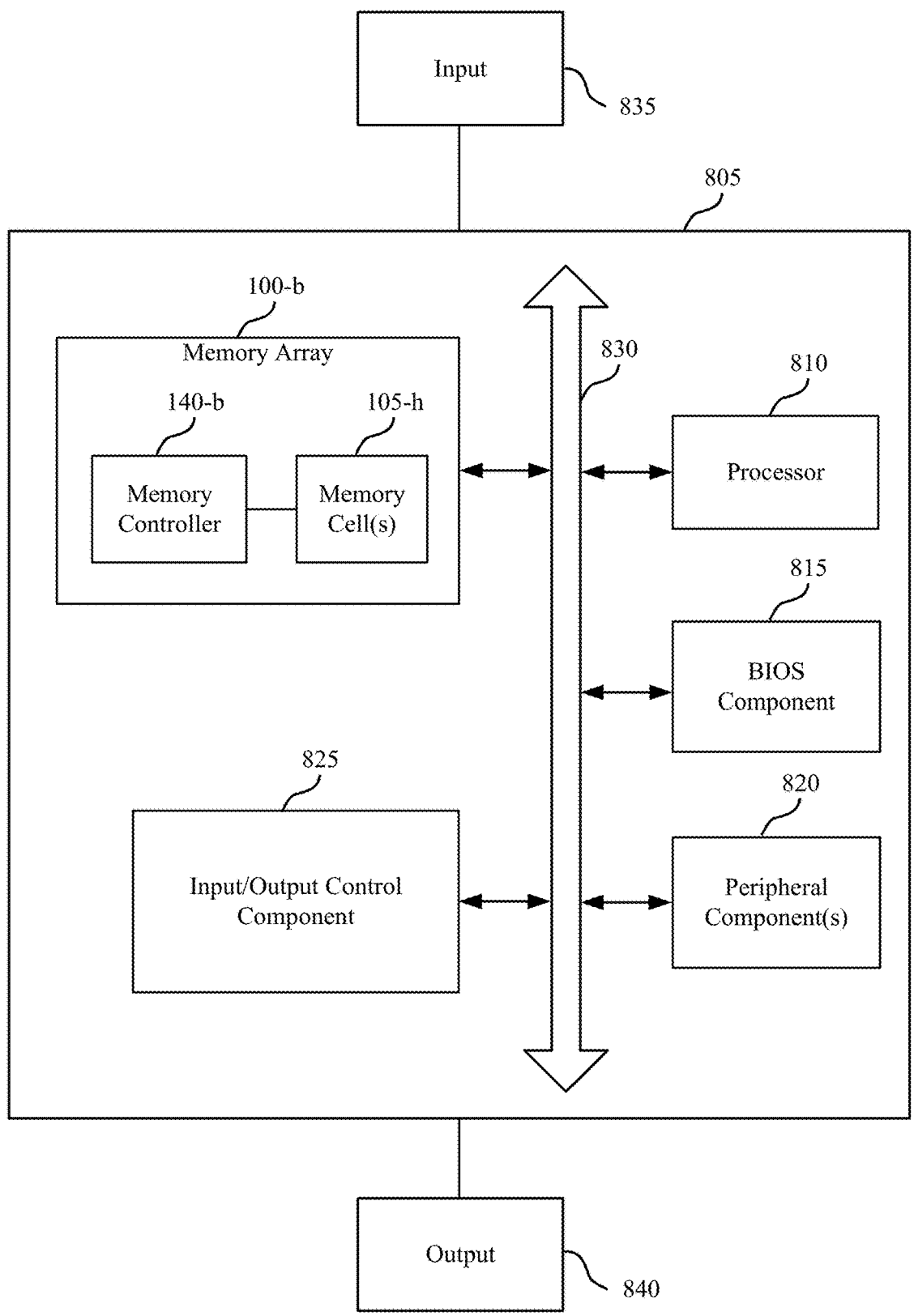
FIG. 8 illustrates a system, including a memory array that supports thermal insulation, in accordance with various embodiments of the present disclosure.

FIG. 8 shows a diagram of a system 800 that supports three-dimensional memory arrays with thermal insulation in accordance with various embodiments of the present disclosure. System 800 may include a device 805, which may be or include a printed circuit board to connect or physically support various components. Device 805 may include a memory array 100-*b*, which may be an example of memory array 100, 100-*a*, 200, 300, 400, 500, or 600 described in FIGS. 1-7. Memory array 100-*b* may contain memory controller 140-*b* and memory cell(s) 105-*h*, which may be examples of memory controller 140 described with reference to FIGS. 1 and 7 and memory cells 105 described with reference to FIGS. 1-7. Device 805 may also include a processor 810, BIOS component 815, peripheral component(s) 820, and input/output controller component 825. The components of device 805 may be in electronic communication with one another through bus 830.

Processor 810 may be configured to operate memory array 100-*b* through memory controller 140-*b*. In some cases, processor 810 performs the functions of memory controller 140-*b* described with reference to FIGS. 1 and 7. In other cases, memory controller 140-*b* may be integrated into processor 810. Processor 810 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 810 may perform various functions described herein, including reading or writing memory cells 105-*h* separated by thermally insulating layers. Processor 810 may, for example, be configured to execute computer-readable instructions stored in memory array 100-*b* to cause device 805 perform various functions or tasks.

BIOS component 815 may be a software component that includes a basic input/output system (BIOS) operated as firmware, which may initialize and run various hardware components of system 800. BIOS component 815 may also manage data flow between processor 810 and the various components, e.g., peripheral components 820, input/output controller component 825, etc. BIOS component 815 may include a program or software stored in read-only memory (ROM), flash memory, or any other non-volatile memory.

Peripheral component(s) 820 may be any input or output device, or an interface for such devices, that is integrated into device 805. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output controller component 825 may manage data communication between processor 810 and peripheral component(s) 820, input 835, or output 840. Input/output controller component 825 may also manage peripherals not integrated into device 805. In some cases, input/output controller component 825 may represent a physical connection or port to the external peripheral.

Input 835 may represent a device or signal external to device 805 that provides input to device 805 or its components. This may include a user interface or interface with or between other devices. In some cases, input 835 may be a peripheral that interfaces with device 805 via peripheral component(s) 820 or may be managed by input/output controller component 825.

Output 840 may represent a device or signal external to device 805 configured to receive output from device 805 or any of its components. Examples of output 840 may include data or signals sent to a display, audio speakers, a printing device, another processor or printed circuit board, etc. In some cases, output 840 may be a peripheral that interfaces with device 805 via peripheral component(s) 820 or may be managed by input/output controller component 825.

The components of memory controller 140-b, device 805, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 9:
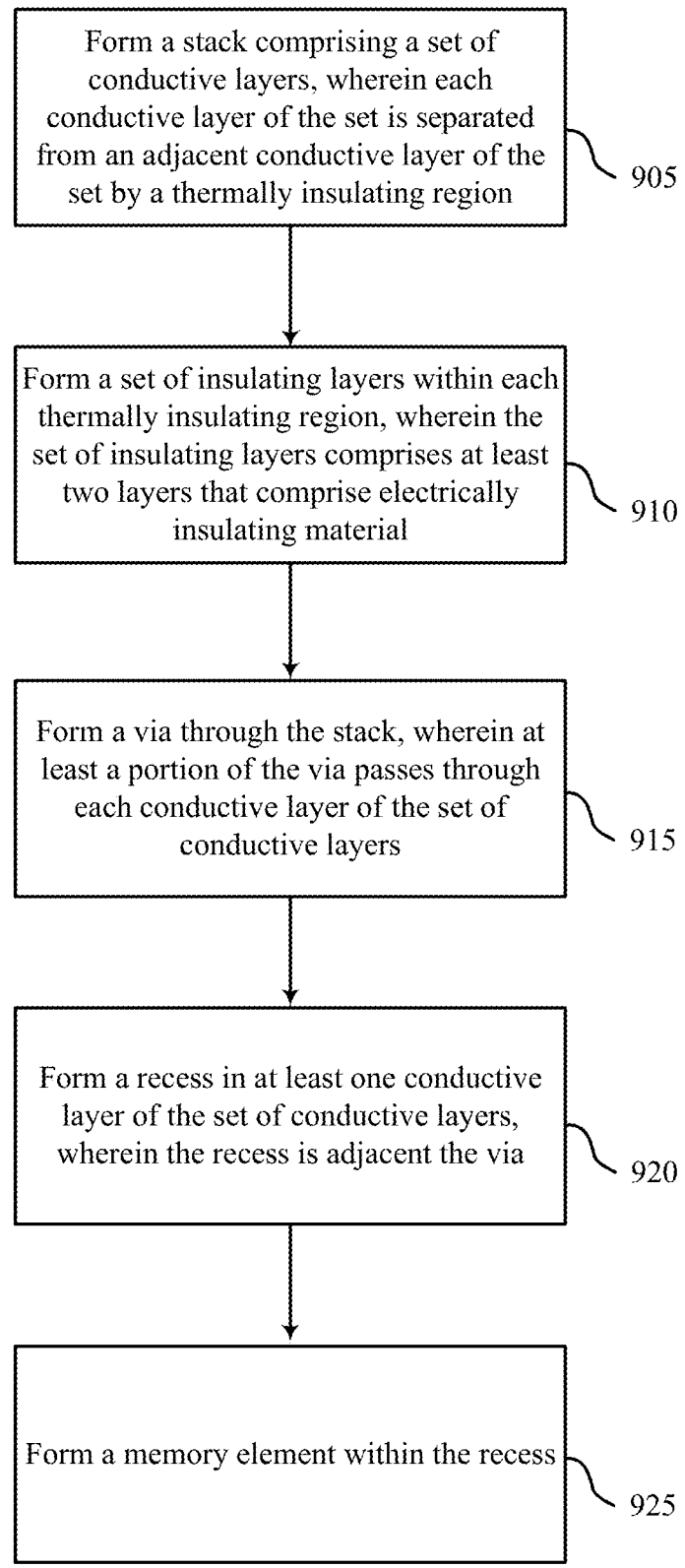
FIG. 9 is a flowchart illustrating a method for forming a three-dimensional memory array with thermal insulation in accordance with various embodiments of the present disclosure.

FIG. 9 shows a flowchart illustrating a method 900 of forming a three-dimensional memory array with thermal insulation in accordance with various embodiments of the present disclosure. The formation methods may include those described with reference to FIGS. 2-6. For example, materials or components may be formed through various combinations of material deposition and removal. In some cases, material formation or removal may include one or more photolithography steps not explicitly recited or described.

At block 905, the method may include forming a stack comprising a set of conductive layers, where each conductive layer of the set is separated from an adjacent conductive layer of the set by a thermally insulating region, as described with reference to FIGS. 1-6.

At block 910, the method may include forming a set of insulating layers within each thermally insulating region, where the set of insulating layers comprises at least two layers that comprise electrically insulating material as described with reference to FIGS. 1-6. In some cases, the method may include forming a first electrically insulating layer that comprises a first material and forming a second electrically insulating layer positioned on top of the first electrically insulating layer, where the second electrically insulating layer comprises a second material that is different from the first material. In other cases, the method may include forming a first electrically insulating layer according to a first set of formation parameters and forming a second electrically insulating layer according to a second set of formation parameters that is different from the first set of formation parameters, where the first insulating layer and the second insulating layer comprise a same material.

In some examples, the method at block 910 may include forming a first electrically insulating layer that comprises a first material, forming a second layer positioned on top of the first electrically insulating layer, where the second layer comprises a second material different from the first material, and forming a third layer positioned on top of the second layer, where the first and third layer comprise a same material. In some cases, the first and third materials may be different. In some instances, the second material comprises at least one of a metal, a metal alloy, carbon, or a compound comprising silicon and nitrogen.

At block 915, the method may include forming a via through the stack, where at least a portion of the via passes through each conductive layer of the set of conductive layers as described with reference to FIGS. 1-6.

At block 920, the method may include forming a recess in at least one conductive layer of the set of conductive layers, where the recess is adjacent the via as described with reference to FIGS. 1-6.

At block 925, the method may include forming a memory element within the recess as described with reference to FIGS. 1-6. In some cases, the memory element may be a chalcogenide material or a phase change material.

The method may also include forming a first conductive element on a surface of the via, where the first conductive element is coupled to the memory element, forming a selection component on a surface of the first conductive element in the via, where the selection component is coupled to the first conductive element, and forming a second conductive element, where the second conductive element fills a remainder of the via and is coupled to the selection component. In some examples, the conductive elements, conductive layers, or electrodes may each comprise one of tungsten, tungsten nitride, aluminum, titanium, titanium nitride, silicon, doped polycrystalline silicon, or carbon, or any combination thereof.

In another embodiment, the method may include forming a buffer material on the memory element, where both the buffer material and the memory element are within the recess, forming a selection component on a surface of the via, where the selection component is coupled to the buffer material and the buffer material separates the selection component and the memory element, and forming a conductive element, where the conductive element fills a remainder of the via and is coupled to the selection component.

In yet another embodiment, the method may include forming a conductive element in the via, where the conductive element fills an entirety of the via and is coupled to the memory element, and forming a selection component at an end of the conductive element and coupled to the conductive element. In some cases, the selection component comprises one of a diode, a bipolar junction device, an ovonic threshold selector, a field effect transistor, or a chalcogenide material.

Thus, method 900 may be methods of forming a 3D memory array with thermal insulation. It should be noted that method 900 describes possible implementations, and the operations and steps may be rearranged or otherwise modified such that other implementations are possible.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

As used herein, "coupled to" indicates components that are substantially in contact with one another. In some cases, two components may be coupled even if a third material or component physically separates them. This third component may not substantially alter the two components or their functions. Instead, this third component may aid or enable the connection of the first two components. For example, some materials may not strongly adhere when deposited on a substrate material. Thin (e.g., on the order of a few nanometers or less) layers, such as lamina layers, may be used between two materials to enhance their formation or connection. In other cases, a third material may act as a buffer to chemically isolate two components.

The term "layer" used herein refers to a stratum or sheet of a geometrical structure. Each layer may have three dimensions (e.g., height, width, and depth) and may cover some or all of a surface below. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by spin-coating the photoresist on the base material. A pattern may be created in the photoresist by exposing the photoresist to radiation. The pattern may be defined by, for example, a photomask that spatially delineates where the radiation exposes the photoresist. Exposed photoresist areas may then be removed, for example, by chemical treatment, leaving behind the desired pattern. In some cases, the exposed regions may remain and the unexposed regions may be removed.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means. A portion or cut of a substrate contain a memory array or circuit may be referred to as a die.

Chalcogenide materials may be materials or alloys that include at least one of the elements sulfur (S), selenium (Se), and tellurium (Te). Phase change materials discussed herein may be chalcogenide materials. Chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk, and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of forming a three dimensional memory array, comprising:
    forming a stack comprising a set of conductive layers, wherein:
        each conductive layer of the set of conductive layers is separated from an adjacent conductive layer of the set of conductive layers by a set of layers, the adjacent conductive layer having a first thermal resistance and the set of layers having a second thermal resistance greater than the first thermal resistances;
        the set of layers comprises at least two layers that comprise a first electrically insulating material;
        the set of layers comprises at least one layer that comprises a second material that is different from the first electrically insulating material; and
        the second material comprises at least one of a metal, a metal alloy, carbon, or a compound comprising silicon and nitrogen;
    forming a via through the stack, wherein at least a portion of the via passes through each conductive layer of the set of conductive layers;
    forming a recess in at least one conductive layer of the set of conductive layers, wherein the recess is adjacent the via; and
    forming a memory cell within the recess.

2. The method of claim 1, wherein forming the set of layers comprises:
forming a first electrically insulating layer that comprises the first electrically insulating material having a first stoichiometry; and
forming a second electrically insulating layer positioned on top of the first electrically insulating layer, wherein the second electrically insulating layer comprises the first electrically insulating material having a second stoichiometry that is different from the first stoichiometry.

3. The method of claim 2, further comprising:
forming the first electrically insulating layer using a reactant in a first concentration; and
forming the second electrically insulating layer using the reactant in a second concentration that is different from the first concentration.

4. The method of claim 1, wherein the set of layers comprises at least three layers that each comprise the first electrically insulating material.

5. The method of claim 4, wherein forming the set of layers comprises:
forming a first electrically insulating layer that comprises the first electrically insulating material having a first stoichiometry;
forming a second electrically insulating layer positioned on top of the first electrically insulating layer, wherein the second electrically insulating layer comprises the first electrically insulating material having a second stoichiometry that is different from the first stoichiometry; and
forming a third electrically insulating layer positioned on top of the second electrically insulating layer, wherein the third electrically insulating layer comprises the first electrically insulating material having a third stoichiometry that is different from the second stoichiometry.

6. The method of claim 5, wherein the third stoichiometry is different from the first stoichiometry.

7. The method of claim 1, wherein the first electrically insulating material comprises an electrically insulating oxide material.

8. The method of claim 1, wherein forming the set of layers comprises:
forming a first electrically insulating layer that comprises the first electrically insulating material;
forming a second layer positioned on top of the first electrically insulating layer, wherein the second layer comprises the second material; and
forming a third layer positioned on top of the second layer, wherein the third layer comprises the first electrically insulating material.

9. The method of claim 1, wherein forming the stack, the set of layers, and the memory cell comprises:
depositing material using one of chemical vapor deposition, metal-organic chemical vapor deposition, physical vapor deposition, or atomic layer deposition.

10. The method of claim 1, further comprising:
forming a first conductive element on a surface of the via, wherein the first conductive element is coupled to the memory cell;
forming an intervening component on a surface of the first conductive element in the via, wherein the intervening component is coupled to the first conductive element; and
forming a second conductive element, wherein the second conductive element fills a remainder of the via and is coupled to the intervening component.

11. The method of claim 1, further comprising:
forming an intervening material on the memory cell, wherein both the intervening material and the memory cell are formed within the recess;
forming an intervening component on a surface of the via, wherein the intervening component is coupled to the intervening material and the intervening material separates the intervening component and the memory cell; and
forming a conductive element, wherein the conductive element fills a remainder of the via and is coupled to the intervening component.

12. The method of claim 1, further comprising:
forming a conductive element in the via, wherein the conductive element fills an entirety of the via and is coupled to the memory cell; and
forming an end component at an end of the conductive element and coupled to the conductive element, wherein the end component comprises one of a diode, a bipolar junction device, an ovonic threshold selector, a field effect transistor, or a chalcogenide material.

13. The method of claim 1 wherein the memory cell comprises a chalcogenide material.

14. A method of forming a three dimensional memory array, comprising:
forming a stack comprising a set of conductive layers, wherein:
a first conductive layer of the set of conductive layers is separated from a second conductive layer of the set of conductive layers by an insulating region comprising a set of at least two layers, the second conductive layer having a first thermal resistance and the insulating region having a second thermal resistance greater than the first thermal resistance;
the set of at least two layers comprises a first layer that comprises a first electrically insulating material and a second layer that comprises the first electrically insulating material; and
the set of at least two layers comprises a third layer that comprises a second material that is different from the first electrically insulating material; and
the second material comprises at least one of a metal, a metal alloy, carbon, or a compound comprising silicon and nitrogen;
forming a via through the stack, wherein at least a portion of the via passes through the first conductive layer and the second conductive layer;
forming a recess in at least one of the first conductive layer and the second conductive layer; and
forming a memory cell within the recess.

15. The method of claim 14, further comprising:
forming a conductive element that fills the via and is in electronic communication with the memory cell; and
forming an intervening material in contact with the memory cell, wherein the intervening material separates the memory cell and the conductive element.

16. The method of claim 15, wherein the intervening material and the memory cell are formed within the recess.

17. A method of forming a three dimensional memory array, comprising:
forming a set of conductive layers, wherein:
each conductive layer of the set of conductive layers has a first thermal resistance and is separated from another conductive layer of the set of conductive layers by a set of at least two layers, the set of at least two layers having a second thermal resistance greater than the first thermal resistance;

the set of at least two layers comprises a first layer that comprises a first electrically insulating material and a second layer that comprises the first electrically insulating material; and the set of at least two layers comprises a third layer that comprises a second material that is different from the first electrically insulating material; and the second material comprises at least one of a metal, a metal alloy, carbon, or a compound comprising silicon and nitrogen;

forming a via that passes through at least a subset of the set of conductive layers;

forming a recess in at least one conductive layer of the set of conductive layers through which the via passes; and forming a memory cell within the recess.

* * * * *